US006665408B1

(12) United States Patent
Schott

(10) Patent No.: US 6,665,408 B1
(45) Date of Patent: Dec. 16, 2003

(54) DYNAMIC BASS CONTROL CIRCUIT WITH VARIABLE CUT-OFF FREQUENCY

(75) Inventor: Wayne Milton Schott, Seymour, TN (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/191,843

(22) Filed: Nov. 13, 1998

(51) Int. Cl.[7] .................................................. H03G 5/00
(52) U.S. Cl. ......................... 381/38; 381/100; 381/101; 381/102; 381/103
(58) Field of Search .............................. 381/61, 62, 63, 381/66, 98, 99, 100, 101, 102, 103, 104, 106, 107, 108, 120

(56) References Cited

U.S. PATENT DOCUMENTS 5,305,388 A * 4/1994 Konno ........................ 381/98

FOREIGN PATENT DOCUMENTS

| | | | |
|---|---|---|---|
| EP | 0106738 A2 * | 4/1984 | ............ H03G/3/20 |
| EP | 0554962 A1 * | 8/1993 | |

* cited by examiner

*Primary Examiner*—Duc Nguyen
(74) *Attorney, Agent, or Firm*—Edward W. Goodman

(57) ABSTRACT

A circuit for providing a variable amount of bass control on an input signal dependent on a signal level of the input signal includes a high-pass filter, a variable impedance shunt connected to the output of the high-pass filter, and a signal level detector for controlling the variable impedance shunt. Depending on the signal level, the variable impedance shunt varies the Q value of the high-pass filter so that at low signal levels, the Q value is at its maximum while at high signal values, the Q value is lowered.

4 Claims, 4 Drawing Sheets

DYNAMIC BASS CONTROL CIRCUIT WITH VARIABLE CUT-OFF FREQUENCY

BACKGROUND OF THE INVENTION

1. Field of the Invention

The subject invention relates to the processing of audio signals, and more particularly, to boosting the bas response of audio signals.

2. Description of the Related Art

It is common for audio systems to include controls for boosting and/or attenuating the bass response of the audio signal to suit the preferences of a user of the audio system. However, it has been found that while a particular adjustment may be satisfactory for low signal levels, as the signal level increases, the set amount of boost may cause overloading of the amplifier and/or damage to the loudspeakers and/or loudspeaker enclosures attached to the system.

European Patent Application EP 0 122 663 to Freadman discloses a method and system for improving speaker performance in which the magnitude level is detected for both low and high frequency portions of an input audio signal. Based on these detected magnitude levels, low and high frequency active voltage control shaper circuits generate control signals for a constant velocity equalizer to dynamically control the high and low frequency response such that at low input signal levels, the high and low frequency portions of the input signal are boosted, while at higher input signal levels, the high and low frequency portions are boosted to a lesser extent.

European Patent Application EP 0 554 962 to Laupman discloses tone control circuitry having a frequency characteristic dependent on the input signal level, in which the low frequency boost of the Freadman circuit is enhanced by coupling a fixed filter circuit to the Freadman circuit.

SUMMARY OF THE INVENTION

It is an object of the invention to provide a dynamic bass control circuit which is considerably simpler than the known systems.

This object is achieved in a circuit for providing a variable amount of bass control on an input signal dependent on a signal level of said input signal, said circuit comprising an input for receiving the input signal; high-pass filtering means coupled to said input, said high-pass filtering means having an output forming an output of said circuit; means for coupling the output of said high-pass filtering means to ground, said coupling means having a variable impedance in response to a control signal, wherein said coupling means varies a Q value of said high-pass filtering means; and means coupled to said input for detecting a signal level of said input signal, said detecting means generating said control signal for said coupling means in dependence on said detected signal level.

The fundamental operating principle of the subject invention is to vary the Q value of a second order high-pass filter so as to cause an increase in Q under low level input signal conditions, while causing a lowering of the Q of the filter with high level input signals. This is achieved by placing a control element in shunt across the output of the high-pass filter such that at low signal levels, the control element is open effectively removing the shunt allowing the filter to operate in its maximum Q condition. At increased signal levels, the control element is closed and the filter is loaded by the shunting resistance causing a lowering of the Q value and also increasing the cut-off frequency of the high-pass filter.

BRIEF DESCRIPTION OF THE DRAWINGS

With the above and additional objects and advantages in mind as will hereinafter appear, the invention will be described with reference to the accompanying drawings, in which.

DESCRIPTION OF THE PREFERRED EMBODIMENTS

Figure 1:
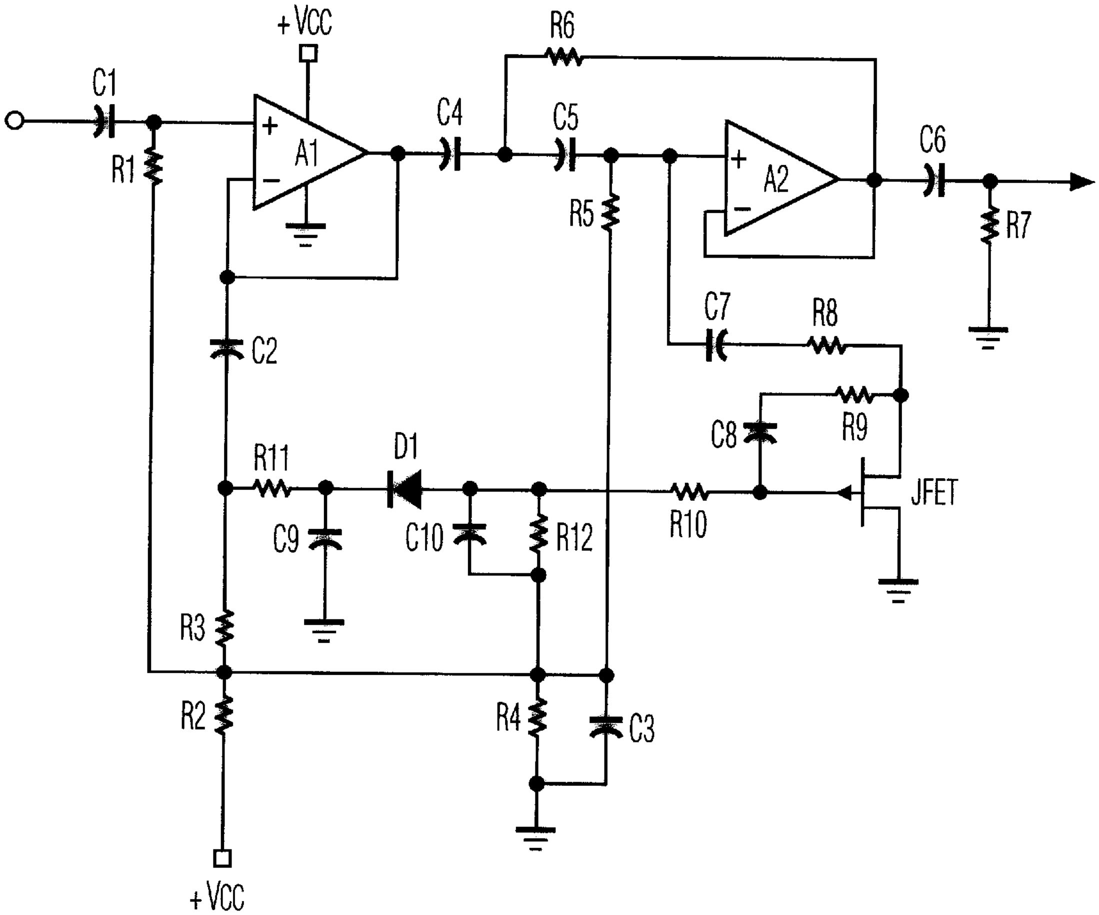
FIG. 1 is a schematic circuit diagram of a first embodiment of a bass control circuit of the subject invention.

FIG. 1 shows a first embodiment of the dynamic bass control circuit of the subject invention which includes an input $V_{IN}$ for receiving an audio signal. The input $V_{IN}$ is connected through a capacitor C1 to a non-inverting input of an amplifier A1. The non-inverting input is further connected to a voltage source $+V_{CC}$ through a series combination of resistors R1 and R2. The output of amplifier A1 is connected to its inverting input and, via a capacitor C2 and a resistor R3, to the junction between resistors R1 and R2, which is connected to ground via the parallel arrangement of a resistor R4 and a capacitor C3. The output of amplifier A1 is connected through the series arrangement of capacitors C4 and C5 to the non-inverting input of amplifier A2 which is also connected to the junction between resistors R1 and R2 by a resistor R5. The junction between capacitors C4 and C5 is connected to the output of amplifier A2 via a resistor R6. The combination of capacitors C4 and C5, and resistors R5 and R6 form high-pass filtering means, while the amplifier A2 forms an output amplifier of the high-pass filtering means. The output of amplifier A2 is connected to its inverting input and to ground via the series arrangement of a capacitor C6 and a resistor R7. The junction between capacitor C6 and resistor R7 forms the output $V_{OUT}$ of the dynamic bass control circuit.

The non-inverting input of amplifier A2 is further connected to the series arrangement of a capacitor C7, a resistor R8, which is, in turn, connected to a drain terminal of a JFET, and, via a series arrangement of a resistor R9 and a capacitor C8, to the gate of the JFET, the source terminal of the JFET being connected to ground. Arranged as such, the JFET forms coupling means for coupling the output of the high-pass filtering means to ground. The gate of the JFET is further connected to the junction between capacitor C2 and resistor R3 by the series arrangement of resistor R10, diode D1 and resistor R11, the junction between diode D1 and resistor R11 being connected to ground via a capacitor C9, and the junction between resistor R10 and diode D1 being connected to the junction between resistors R2 and R3 by a parallel arrangement of a capacitor C10 and a resistor R12. The combination of resistors R1–R4 and R10–R12, capacitors C9 and C10, and diode D1 form detecting means for detecting the signal level of the input signal $V_{IN}$.

In operation, when the input signal level is sufficiently low, the JFET, which is placed in shunt across the output of the high-pass filtering means, is turned off thereby removing the shunting effect allowing the high-pass filtering means to operate in its maximum Q condition. As the input signal level increases, the JFET is turned on thereby loading the high-pass filtering means with the shunting resistance causing a lowering of the Q value, and also increasing the cut-off frequency of the high-pass filtering means.

Table 1 shows a first and second set of values A and B for the components in FIG. 1:

TABLE 1

| COMPONENT | A | B |
|---|---|---|
| R1 | 100 KΩ | 100 KΩ |
| R2, R4 | 1 KΩ | 1 KΩ |
| R3 | 10 KΩ | 10 KΩ |
| R5 | 560 KΩ | 120 KΩ |
| R6 | 4.7 KΩ | .20 KΩ |
| R7 | 100 KΩ | 10 KΩ |
| R8 | 120 KΩ | 33 KΩ |
| R9, R10, R12 | 1 MΩ | 1 MΩ |
| R11 | 4.7 KΩ | 4.7 KΩ |
| C1 | 5 μf | 5 μf |
| C2 | 47 μf | 47 μf |
| C3 | 100 μf | 100 μf |
| C4 | 0.068 μf | 0.1 μf |
| C5 | 0.15 μf | 0.1 μf |
| C6 | 5 μf | 0.47 μf |
| C7 | 0.1 μf | 1 μf |
| C8 | 0.01 μf | 0.01 μf |
| C9 | 0.22 μf | 0.22 μf |
| C10 | 1 μf | 1 μf |

Figure 2A:
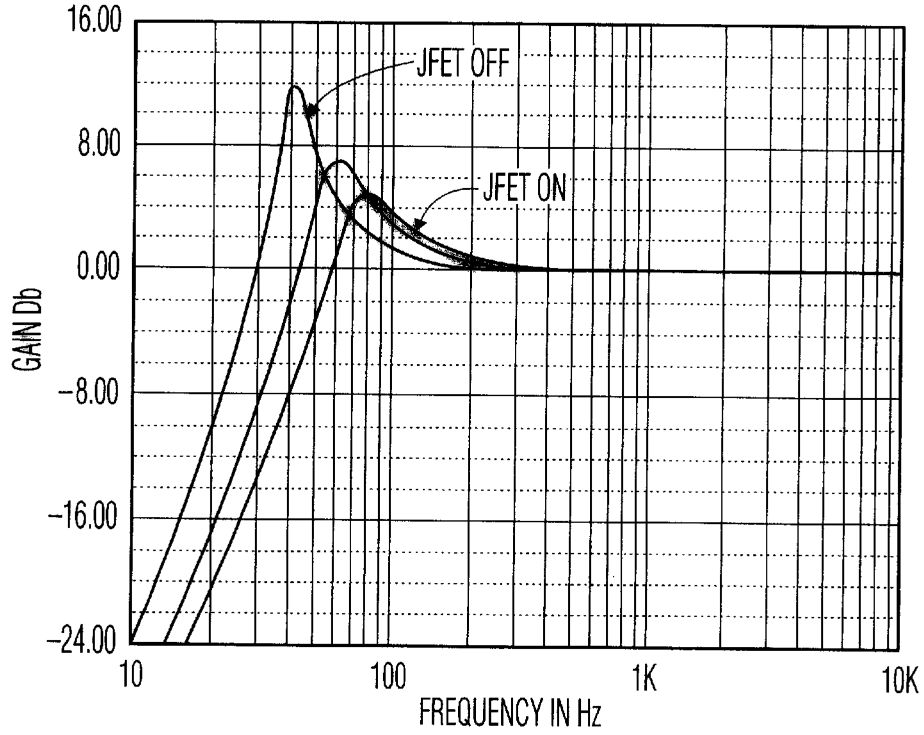
FIGS. 2A and 2B show response curves for the circuit of FIG. 1 using various values for the components.
Figure 2B:
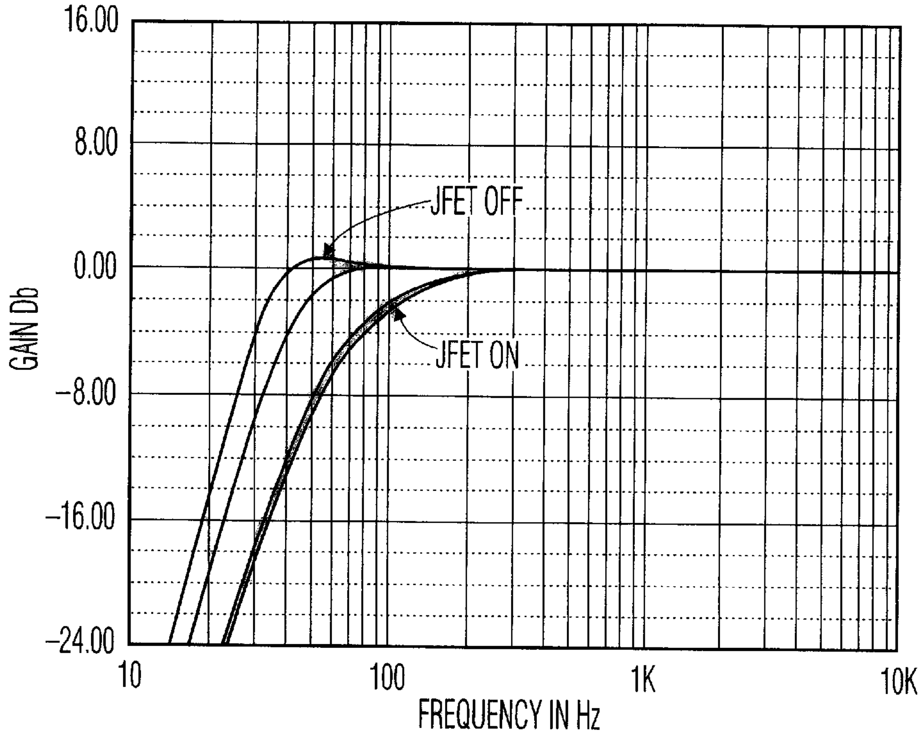

FIG. 2A shows response curves for the circuit of FIG. 1 using the first set of values A in Table 1, while FIG. 2B shows the response curves using the second set of values B in Table 1.

Figure 3:
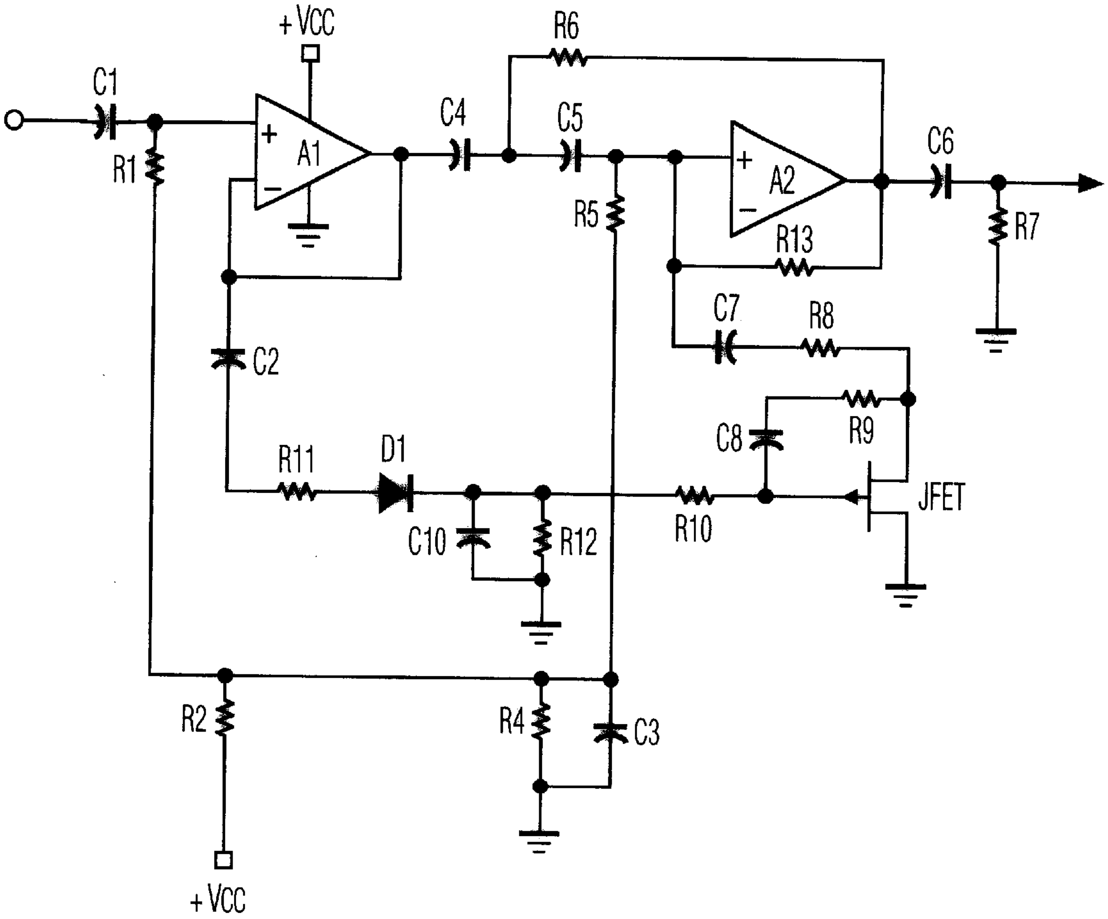
FIG. 3 is a schematic circuit diagram of a second embodiment of a bass control circuit of the subject invention.

FIG. 3 shows a second embodiment of the invention. This second embodiment is substantially similar to the first embodiment of FIG. 1 with the following exceptions. Resistor R3 has been eliminated and the capacitor C2 is connected only to resistor R11. Capacitor C9 has been eliminated and the conducting direction of diode D1 has been reversed. The parallel combination of capacitor C10 and resistor R12 is now connected directly to ground. Capacitor C7 is now connected to the inverting input of amplifier A2, the output now being connected to the inverting input through a resistor R13.

In this second embodiment, the JFET shunts the inverting input of the amplifier A2. As such, when the input signal level is sufficiently low, the JFET is turned on causing an increase in the gain of amplifier A2. This increase in gain increases the Q value of the high-pass filter. When the input signal level increases, the JFET is turned off, the Q value of the filter is lowered and the gain of amplifier A2 is lowered.

Table 2 shows a set of values for the components in the second embodiment of FIG. 3:

TABLE 2

| COMPONENT | VALUE |
|---|---|
| R1, R7 | 100 KΩ |
| R2, R4 | 1 KΩ |
| R5 | 36 KΩ |
| R6 | 22 KΩ |
| R8, R13 | 150 KΩ |
| R9, R10, R12 | 1 MΩ |
| R11 | 4.7 KΩ |
| C1, C6 | 5 μf |
| C2 | 47 μf |
| C3 | 100 μf |
| C4, C5 | 0.15 μf |
| C7 | 0.47 μf |
| C8 | 0.01 μf |
| C10 | 1 μf |

Figure 4:
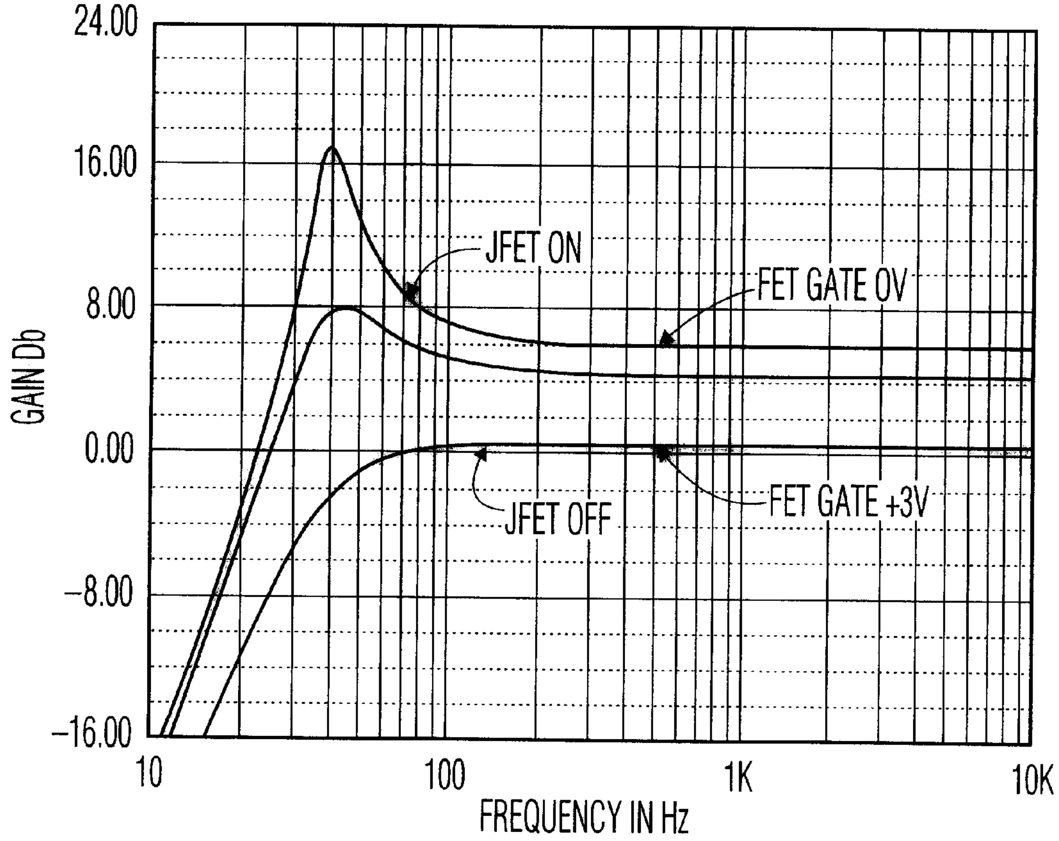
FIG. 4 shows response curves for the circuit of FIG. 3.

FIG. 4 is a graph showing the response curve for the second embodiment of FIG. 3 using the values in Table 2.

Numerous alterations and modifications of the structure herein disclosed will present themselves to those skilled in the art. However, it is to be understood that the above described embodiment is for purposes of illustration only and not to be construed as a limitation of the invention. All such modifications which do not depart from the spirit of the invention are intended to be included within the scope of the appended claims.

What is claimed is:

1. A circuit for providing a variable amount of bass control on an input signal dependent on a signal level of said input signal, said circuit comprising:

an input for receiving the input signal;

high-pass filtering means coupled to said input, said high-pass filtering means having an output forming an output of said circuit;

coupling means for coupling the output of said high-pass filtering means to ground, said coupling means having a variable impedance in response to a control signal, wherein said coupling means varies a Q value of said high-pass filtering means; and detecting means coupled to said input for detecting a signal level of said input signal, said detecting means generating said control signal for said coupling means in dependence on said detected signal level.

2. A circuit as claimed in claim 1, wherein said coupling means comprises a field-effect transistor.

3. A circuit as claimed in claim 1, wherein said high-pass filtering means includes an output amplifier and said coupling means couples a non-inverting input of said output amplifier to ground.

4. A circuit as claimed in claim 1, wherein said high-pass filtering means includes an output amplifier and said coupling means couples an inverting input of said output amplifier to ground.

* * * * *